United States Patent
Choi

(10) Patent No.: US 12,131,926 B2
(45) Date of Patent: Oct. 29, 2024

(54) APPARATUS INCLUDING ARRAYS OF PICK-UP HEADS AND BONDING HEADS AND A METHOD OF USING THE SAME

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 18/053,414

(22) Filed: Nov. 8, 2022

(65) Prior Publication Data
US 2024/0153798 A1 May 9, 2024

(51) Int. Cl.
H01L 21/67 (2006.01)
H01L 21/683 (2006.01)

(52) U.S. Cl.
CPC .... *H01L 21/67259* (2013.01); *H01L 21/6833* (2013.01)

(58) Field of Classification Search
CPC ........... H01L 21/67259; H01L 21/6833; H01L 21/67144
USPC ......................................................... 361/234
See application file for complete search history.

(56) References Cited

U.S. PATENT DOCUMENTS

| | | | |
|---|---|---|---|
| 6,205,745 B1 | 3/2001 | Dudderar et al. | |
| 7,117,581 B2 | 10/2006 | Arneson et al. | |
| 7,564,118 B2 | 7/2009 | Pogge et al. | |
| 2011/0079361 A1* | 4/2011 | Park | H01L 24/75 156/556 |
| 2016/0079199 A1* | 3/2016 | Seok | B23K 3/04 228/9 |
| 2019/0027388 A1* | 1/2019 | Seyama | H01L 21/67259 |
| 2019/0385972 A1* | 12/2019 | Jiang | H01L 24/97 |

(Continued)

FOREIGN PATENT DOCUMENTS

WO 03058708 A1 7/2003
WO 2022212260 A1 10/2022

(Continued)

OTHER PUBLICATIONS

Son, S. et al. "Characteristics of Plasma-activated Dielectric Film Surfaces for Direct Wafer Bonding," IEEE Electronic Components and Technology Conference (ECTC), 2020, pp. 2025-2032.

*Primary Examiner* — Thienvu V Tran
*Assistant Examiner* — Sreeya Sreevatsa
(74) *Attorney, Agent, or Firm* — Abel Schillinger, LLP

(57) ABSTRACT

An apparatus can include a source chuck, an array of pick-up heads, an array of bonding heads, and a product chuck. The source chuck can have a source holding surface facing a first direction. The array of pick-up heads can have pick-up surfaces facing a second direction opposite the first direction and configured to have an adjustable pitch that can be reversibly changed between a source-matching pitch and a bonding head-matching pitch. The array of bonding heads can have holding surfaces facing the first direction and configured to be at a bonding head pitch. The product chuck can have a product holding surface facing the second direction. The apparatus can be used to transfer chips from a source substrate to a product substrate and bond the chips to product bonding sites of the product substrate.

21 Claims, 6 Drawing Sheets

(56) References Cited

U.S. PATENT DOCUMENTS

2020/0144218 A1* 5/2020 Wang ................ H01L 21/67144
2023/0245996 A1 8/2023 Sreenivasan

FOREIGN PATENT DOCUMENTS

WO 2023056068 A1 4/2023
WO 2023056072 A1 4/2023

* cited by examiner

APPARATUS INCLUDING ARRAYS OF PICK-UP HEADS AND BONDING HEADS AND A METHOD OF USING THE SAME

FIELD OF THE DISCLOSURE

The present disclosure relates to apparatuses including arrays of pick-up heads and bonding heads and methods of using the apparatus.

RELATED ART

Advanced packaging technologies demand high throughput, yet, precise placement of chips continues to be more difficult. Hybrid bonding can be particularly challenging with small misalignment tolerances. A single-chip transfer technique can achieve high precision but has a low throughput. A multi-chip transfer technique can achieve the high throughput but precise placement of chips can be difficult. A need exists for a placement high throughput while still meeting specifications for chip placement.

SUMMARY

An apparatus can include a source chuck, an array of pick-up heads, an array of bonding heads, and a product chuck. The source chuck can have a source holding surface facing a first direction. The array of pick-up heads can have pick-up surfaces facing a second direction opposite the first direction and be configured to have an adjustable pitch that can be reversibly changed between a source-matching pitch and a bonding head-matching pitch. The array of bonding heads can have holding surfaces facing the first direction and be configured to be at a bonding head pitch. The product chuck can have a product holding surface facing the second direction.

In an embodiment, the apparatus is configured such that the bonding head pitch is within a first tolerance of a product pitch during a bonding head-to-product substrate transfer state, the bonding head-matching pitch for the array of pick-up heads is within a second tolerance of the bonding head pitch during a pick-up head-to-bonding head transfer state, and the second tolerance is different from the first tolerance.

In another embodiment, the apparatus can further include a pick-up head carriage coupled to the array of pick-up heads.

In a particular embodiment, the apparatus can further include a product carriage coupled to the product chuck.

In a more particular embodiment, the pick-up head carriage and the product carriage are configured to move during a transfer cycle.

In an even more particular embodiment, the apparatus can further include a base coupled to the pick-up head carriage and the product carriage.

In a further embodiment, the apparatus can further include a bridge coupled to the source chuck and the array of bonding heads.

In a particular embodiment, the apparatus can further include a reference coupled to the bridge, wherein the reference includes an alignment mark.

In a more particular embodiment, the apparatus can further include an alignment hardware coupled to a product carriage and configured to align to the alignment mark of the reference.

In still another embodiment, a particular pick-up head within the array of pick-up heads can be configured to pick up a chip from the source chuck without contacting a surface along a major side of the chip, wherein the surface of the chip faces the pick-up surface of the particular pick-up head.

In yet another embodiment, a pick-up head within the array of pick-up heads has a projection that is configured to contact a side of a chip or a side of a backing plate coupled to the chip.

In another aspect, an apparatus can include a source chuck with a source holding surface facing a first direction, an array of pick-up heads having pick-up surfaces facing a second direction opposite the first direction, an array of bonding heads having holding surfaces facing the first direction, a product chuck having a product holding surface facing the second direction, a pick-up head carriage coupled to the array of pick-up heads, a product carriage coupled to the product chuck, a bridge coupled to the source chuck and the array of bonding heads, and a base spaced apart from the bridge and coupled to the pick-up head carriage and the product carriage.

In a further aspect, a method can include mounting a source substrate onto a source chuck, wherein the source substrate includes a plurality of chips, bonding surfaces of the plurality of chips face a first direction, and a first set of chips within the plurality of chips is at a source pitch. The method can also include picking up the first set of chips with an array of pick-up heads, wherein the array of pick-up heads has pick-up surfaces that face a second direction opposite the first direction, and the array of pick-up heads is at a source-matching pitch. The method can further include changing the array of pick-up heads from the source-matching pitch to a bonding head-matching pitch and transferring the first set of chips to an array of bonding heads having holding surfaces that face the first direction. The array of bonding heads can be at a bonding head pitch, and the array of pick-up heads can be at the bonding head-matching pitch. The method can further include bonding the first set of chips to a first set of product bonding sites of a product substrate, wherein the product substrate is coupled to a product chuck, and the first set of product bonding sites faces the second direction and is at a product bonding pitch.

In an embodiment, changing the array of pick-up heads from the source-matching pitch to the bonding head-matching pitch is performed while the first set of chips is coupled to the array of pick-up heads.

In another embodiment, the method further includes changing the array of pick-up heads from the bonding head-matching pitch to the source-matching pitch after transferring the first set of chips to the array of bonding heads.

In still another embodiment, mounting the source substrate onto the source chuck includes mounting the source substrate, wherein the plurality of chips includes a second set of chips. The method can further include picking up the second set of chips with the array of pick-up heads, wherein the array of pick-up heads is at the source-matching pitch; changing the array of pick-up heads from the source-matching pitch to the bonding head-matching pitch; transferring the second set of chips to the array of bonding heads; and bonding the second set of chips to a second set of product bonding sites of the product substrate, wherein the second set of product bonding sites faces the second direction.

In a particular embodiment, from a first time when the first set of chips is transferred from the array of pick-up heads to the array of bonding heads to a second time when the second set of chips is bonded to the product bonding sites, bodies of the array of the bonding heads can remain at the bonding head pitch.

In another particular embodiment, the method can further include aligning a product carriage to an alignment mark of a reference after bonding the first set of chips to the product substrate and before bonding the second set of chips to the product substrate, wherein no chips from the source substrate are bonded to the product substrate between bonding the first set of chips to the product substrate and bonding the second set of chips to the product substrate.

In still another embodiment, the method can further include moving a pick-up head carriage from a source location to a bonding head location. The array of pick-up heads can be coupled to the pick-up head carriage. When the pick-up head carriage is at the source location, the array of pick-up heads can face the source substrate, and when the pick-up head carriage is at the bonding head location, the array of pick-up heads can face the holding surfaces of the array of bonding heads.

In a further embodiment, picking up the first set of chips is performed without contacting surfaces along major surfaces of the first set of chips while the surfaces face the array of pick-up heads.

In another embodiment, the array of pick-up heads faces the source substrate when the array of bonding heads faces the product substrate.

BRIEF DESCRIPTION OF THE DRAWINGS

Implementations are illustrated by way of example and are not limited in the accompanying figures.

Figure 1:
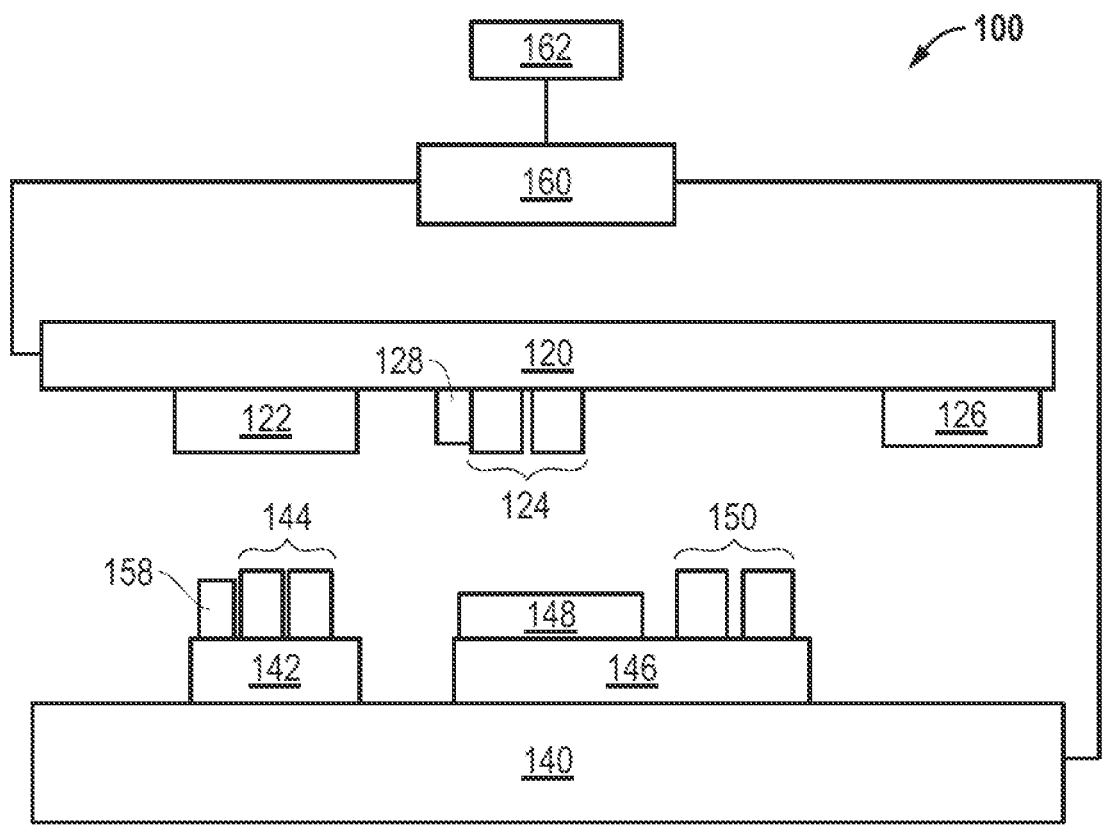
FIG. 1 includes a conceptual view of an apparatus that can be used in transferring chips from a source substrate to a product substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

An apparatus can include a source chuck, an array of pick-up heads, an array of bonding heads, and a product chuck. The source chuck can have a source holding surface facing a first direction. The array of pick-up heads can have pick-up surfaces facing a second direction opposite the first direction. The array of pick-up heads can be configured to have an adjustable pitch that can be reversibly changed between a source-matching pitch and a bonding head-matching pitch. The array of bonding heads can have holding surfaces facing the first direction. The array of bonding head can be configured to be at a bonding head pitch. The product chuck can have a product holding surface facing the second direction.

A method of using the apparatus can include mounting a source substrate onto the source chuck. The source substrate can include a plurality of chips, bonding surfaces of the plurality of chips can face a first direction, and a set of chips within the plurality of chips can be at the source pitch. The method can include picking up the set of chips with an array of pick-up heads, wherein the array of pick-up heads can be at the source-matching pitch. The method can further include changing the array of pick-up heads from the source-matching pitch to the bonding head-matching pitch. The method can include transferring the set of chips to the array of bonding heads, wherein the array of bonding heads can be at the bonding head pitch. The method can further include bonding the set of chips to a set of product bonding sites of a product substrate, wherein the product substrate is coupled to a product chuck, and the set of product bonding sites faces the second direction and is at a product bonding pitch.

As described in more detail below, the apparatus and the method can allow for the transfer of chips from the source substrate to the product substrate at a high throughput rate while still achieving the challenging alignment specifications for hybrid bonding. The arrays of pick-up heads and bonding heads can allow a set of chips to be transferred and bonded to product bonding sites on a product substrate during a single transfer cycle.

The pitch for the array of pick-up heads can be reversibly changed during a transfer cycle from a pitch that is the same or close to a source pitch to another pitch that is the same or closer to the bonding head pitch. The relatively wider allowable tolerances for the pitch of pick-up heads within the array of pick-up heads allows the pitch of the pick-up heads to be switched more quickly between the source-matching pitch and the bonding head-matching pitch. A relatively narrower tolerance for the pitch of the bonding heads is not a significant problem because the arrangement of the array of bonding heads is not changed during a transfer operation that may last for a plurality of transfer cycles.

The orientation of the chips remains the same. During the entire transfer cycle, the device sides of the chips can face the same direction, and the back sides of the chips can face the opposite direction. The need for flipping chips is obviated. Alignment of alignment hardware to a reference can be performed every transfer cycle. Thus, significant alignment drift during the entirety of a transfer operation is substantially reduced.

The apparatus and method are understood better after reading this specification in conjunction with the figures. Implementations described below are exemplary and do not limit the scope of the invention as defined in the appended claims.

FIG. 1 includes a conceptual diagram of an apparatus 100 that can be used to transfer chips coupled to a source chuck 122 to a product substrate coupled to a product chuck 148. FIG. 1 includes the equipment configuration of the apparatus 100 and does not include the chips and the product substrate. The apparatus 100 includes a bridge 120, a base 140, and a controller 160 that is coupled to the bridge 120, the base 140, or to one or more components coupled to the bridge 120 or the base 140. The bridge 120 can be coupled to a source chuck 122, an array of bonding heads 124, and a reference 126 having one or more alignment marks. The base 140 can be coupled to a pick-up head carriage 142 and a product carriage 146.

In FIG. 1 and other figures, the bridge 120, the base 140, and components physically coupled between bridge 120 or the base 140 can be organized along an X-direction, a Y-direction, a Z-direction, or a combination thereof. With respect to cross-sectional or side views, the X-direction is between the left-hand and right-hand sides of the drawings, the Z-direction is between the top and bottom of the drawings, and the Y-direction is into and out of the drawing sheet. Unless explicitly stated to the contrary, rotation occurs along a X-Y plane defined by the X-direction and Y-direction.

Components within the apparatus 100 will be generally described in the order in which a set of chips will be transferred from a source substrate coupled to the source chuck 122 to a product substrate coupled to the product chuck 148. Due to similarities in operation, the pick-up head carriage 142 and the product carriage 146 are described in the same passage later in this specification.

The terms "transfer operation" and "transfer cycle" are addressed to aid in understanding embodiments as described herein. A transfer operation starts no later than picking up a set of chips from the source substrate, where the set of chips will be the first set of chips transferred to the product substrate and ends when the last set of chips is transferred to the product substrate. A transfer cycle starts no later than picking up a particular set of chips from the source substrate until that same particular set of chips is transferred to the product substrate. A transfer operation can include one or more transfer cycles.

The source chuck 122 can be a vacuum chuck, pin-type chuck, a groove-type chuck, an electrostatic chuck, an electromagnetic chuck, or the like. The source chuck 122 can be coupled to the bridge 120 by being attached to the bridge directly or can be coupled to the bridge via a carriage (not illustrated). The source chuck 122 has a source holding surface that faces the base 140 or a component coupled to the base 140. The carriage may be able to provide translating motion as described in more detail below with respect to the pick-up head carriage 142 and the product carriage 146.

The pick-up head carriage 142 and the product carriage 146 are coupled to the base 140 and can provide translating motion along the base 140 in an X-direction, a Y-direction, or a Z-direction or rotational motion about one or more of axes, such as rotation about the Z-axis and along a plane lying along the X-direction and Y-direction. The pick-up head carriage 142 and the product carriage 146 can be moved together or independently relative to each other. The pick-up head carriage 142 and the product carriage 146 can be the same type or different types of carriages.

The array of pick-up heads 144 are coupled to the pick-up head carriage 142 and have pick-up surfaces that face the bridge 120 or a component coupled to the bridge 120. The array of pick-up heads 144 have pick-up surfaces that face the bridge 120 or a component coupled to the bridge 120. The array of pick-up heads 144 can be configured as a vector (a row or a column of pick-up heads) or as a matrix (at least two rows and at least two columns of pick-up heads). Regarding the matrix, the number of bonding heads within the array of pick-up heads 144 may be different between rows, between columns, or between rows and columns. Some array configurations can include 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column. In theory, chips from an entire source wafer may be transferred all at once. For such a configuration, the array of pick-up heads 144 may have fewer pick-up heads along rows closer to the top and bottom of the array as compared to the row or the pair of rows closest to the center of the array, and the array of pick-up heads 144 may have fewer pick-up heads along columns closer to the left-hand side and right-hand side of the array as compared to the column or the pair of columns closest to the center of the array. After reading this specification, skilled artisans will be able to determine an array configuration for the array of pick-up heads 144 that meets the needs or desires for a particular application.

Figure 2:
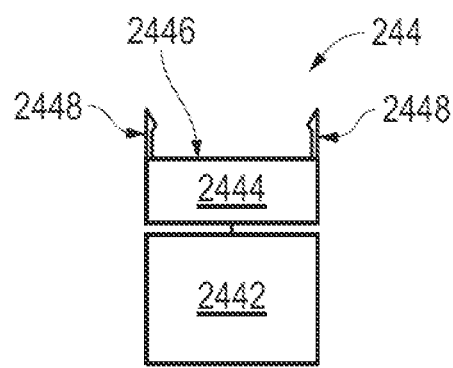
FIG. 2 includes an illustration of a cross-sectional view of a pick-up head in accordance with an embodiment.

FIG. 2 includes an exemplary design for a pick-up head 244 within the array of pick-up heads 144. In FIG. 2, the pick-up head 244 includes a body 2442 and a chip chuck 2444. When the pick-up head 244 is installed, the body 2442 is disposed between the pick-up head carriage 142 and the chip chuck 2444.

The pick-up head 244 has a pick-up surface 2446 that faces the source chuck 122 illustrated in FIG. 1. A chip may or may not contact the pick-up surface 2446. For example, a chip may have an activated surface to assist in hybrid bonding. Chip retention projections 2448 can extend from the chip chuck 2444 to allow the chip to be held along sides between the major surfaces of the chip without an activated surface of the chip contacting the pick-up surface 2446. If the chip is too thin, a backing plate can be attached to the chip, such that the backing plate is disposed between the chip and the pick-up surface 2446. The chip retention projections 2448 can contact the backing plate as the chip is moved from the source chuck 122 to a bonding head within the array of bonding heads 124. More details regarding a combination of a chip and backing plate are addressed later in this specification. Another configuration of the pick-up head may allow a chip to be retained by a chip chuck without an activated surface of the chip contacting a pick-up surface of the pick-up head. Accordingly, the pick-up head 244 in FIG. 2 is exemplary and does not limit the scope of the invention as defined in the appended claims. In an alternative embodiment, the pick-up head may be retained by a chip chuck that is a vacuum chuck, pin-type chuck, a groove-type chuck, an electrostatic chuck, or an electromagnetic chuck.

The array of pick-up heads 144 can be configured to have an adjustable pitch that can be reversibly changed between a source-matching pitch and a bonding head matching pitch.

The array of pick-up heads 144 or the pick-up head carriage 142 can include motors, electrical components or the like that can be activated to move pick-up heads to achieve a desired pitch. The apparatus 100 can be configured to allow at least one pitch change per transfer cycle. On average, the pitch for the array of pick-up heads 144 can change twice during a transfer cycle. As used herein, a pitch is the sum of a width or a length of a feature and the space between the feature and the immediately adjacent feature. The features can be chips at a source substrate, pick-up heads within the array of pick-up heads 144, bonding heads within the array of bonding heads 124, or product bonding sites of the product substrate. The pitch along the X-direction may be the same or different from the pitch in the Y-direction.

In an embodiment, the array of pick-up heads 144 can be at the source-matching pitch when picking up a set of chips from the source chuck 122 and at the bonding head-matching pitch when transferring the chips to the array of bonding heads 124. The source-matching pitch for the array of pick-up heads 144 should be the same as the source pitch of chips to be picked up from a source substrate that is coupled to the source chuck 122, and the bonding head-matching pitch for the array of pick-up heads 144 should be the same as a bonding head pitch for bonding heads within the array of bonding heads 124. In practice, the source-matching pitch is usually slightly different from the source pitch, and the bonding head-matching pitch is usually slightly different from the bonding head pitch. A successful chip transfer can occur when the difference between the source-matching pitch and the source pitch, the difference between the bonding head-matching pitch and the bonding head pitch, or both are within acceptable tolerances. A tolerance may be in a form of a production specification associated with equipment or a method when using the equipment.

After the chips are transferred to the array of bonding heads 124, the pitch for the array of pick-up heads 144 can be changed back to the source-matching pitch before picking up the next set of chips for the next transfer cycle. The changing of the pitch can be performed with or without human intervention. In an embodiment, a signal from the bridge 120, base 140, or any one or more components coupled to the bridge 120 or base 140 can be transmitted to the controller 160 or a local controller, and such controller can transmit a signal to change the pitch for the array of pick-up heads 144. For example, after the array of pick-up heads 144 have picked up a set of chips from the source substrate, a signal can be transmitted to the controller 160 or a local controller that picking up the set of chips has been completed. In response to the signal, the controller 160 or a local controller can transmit a signal to change the pitch for the array of pick-up heads 144 from the source-matching pitch to the bonding head-matching pitch. After the array of pick-up heads 144 have transferred the set of chips to the array of bonding heads 124, a signal can be transmitted to the controller 160 or a local controller that the transfer from the pick-up heads to the bonding heads has been completed. In response to the signal, the controller 160 or a local controller can transmit a signal to change the pitch for the array of pick-up heads 144 from the bonding head-matching pitch to the source-matching pitch.

The array of bonding heads 124 are coupled to the bridge 120. Bonding heads within the array of bonding heads 124 may have any of the designs as described with respect to the pick-up heads within the array of pick-up heads 144. The holding surfaces of the bonding heads may not contact an activated surface of a chip. In an embodiment, the holding surfaces of the bonding heads 124 may contact a surface opposite the activated surface of the chips. Thus, different design considerations may be used for the array of bonding heads 124. Between the arrays 124 and 144, the bonding heads can have the same design or different design as compared to the pick-up heads.

Similar to the array of pick-up heads 144, the array of bonding heads 124 can be configured as a vector (a row or a column of bonding heads) or as a matrix (at least two rows and at least two columns of bonding heads). Regarding the matrix, the number of bonding heads within the array of bonding head 124 may be different between rows, between columns, or between rows and columns. Some array configurations can include 3×1, 6×1, 2×2, 2×3, 2×4, 4×2 10×10, or another rectangular shape, where the first number corresponds to the number of bonding heads along a row or column, and the second number corresponds to the number of bonding heads along the other of the row or column. In theory, chips from an entire wafer may be transferred all at once. For such a configuration, the array of bonding heads 124 may have fewer bonding heads along rows closer to the top and bottom of the array as compared to the row closest to the center of the array, and the array of bonding heads 124 may have fewer bonding heads along columns closer to the left-hand side and right-hand side of the array as compared to the column closest to the center of the array. After reading this specification, skilled artisans will be able to determine an array configuration for the array of bonding heads 124 that meets the needs or desires for a particular application. In an embodiment, the array of bonding heads 124 has the same number of rows and columns as compared to the array of pick-up heads 144.

Each of the bonding heads within the array of bonding heads 124 can include a chip chuck and a body disposed between the chip chuck and the bridge 120. The chip chuck has holding surface for holding a chip. The holding surface faces the base 140 or a component coupled to the base 140. The bonding heads may be configured such that the chip chucks have a limited range of motion relative to their corresponding bodies to provide better positioning when chips are transferred from the array of pick-up heads 144 to a product substrate when coupled to the product chuck 148.

Bodies for the array of bonding heads 124 can be coupled to the bridge 120 and arranged to have a bonding head pitch. The bonding head pitch for the array of bonding heads 124 should be the same as the product pitch, which is the pitch for product bonding sites on the product substrate. In practice, the bonding head pitch is usually different from the product pitch. A successful chip transfer can occur when the difference between the bonding head pitch and the product pitch is within an acceptable tolerance.

The maximum allowable tolerance for the difference between the bonding head pitch for the array of bonding heads 124 and the product pitch for the product substrate is less than the maximum allowable tolerance for the difference between the bonding head pitch for the array of bonding heads 124 and the bonding head-matching pitch for the array of pick-up heads 144. The bodies of the bonding heads within the array of bonding heads 124 are more accurately and precisely placed as compared to the pick-up heads within the array of pick-up heads 144. The positions for the bodies of the bonding heads within the array of bonding heads 124 are typically not changed during a transfer operation.

The product chuck 148 can be coupled to the product carriage 146 and has a product holder surface facing the bridge 120 or a component coupled to the bridge 120. In an embodiment, the product chuck 148 is attached to the product carriage 146. The product chuck 148 can hold a product substrate having the product bonding sites. The product chuck 148 can be a vacuum chuck, pin-type chuck, a groove-type chuck, an electrostatic chuck, an electromagnetic chuck, or the like. The product chuck 148 can be heated, cooled, or both heated and cooled. The product chuck 148 can include a heater. In the same or different embodiment, a fluid (not illustrated) can flow through the product chuck 148 to increase or decrease the temperature of the product chuck 148.

Alignment hardware 150 is coupled to the product carriage 146, and the reference 126 includes one or more alignment marks. The alignment hardware 150 can include an optical component and provide information to the controller 160 or a local controller located within the alignment hardware 150, the product carriage 146, the base 140, or a combination thereof. The alignment hardware 150 can be used to align the product carriage 146 to the one or more alignment marks of the reference 126, align the product carriage 146 to bonding heads within the array of bonding heads 124, or both.

Registration hardware 128 and 158 are coupled to the bridge 120 and the pick-up head carriage 142, respectively. The registration hardware 128 and 158 can include an optical component and provide information to the controller 160 or a local controller located within the registration hardware 128 or 158, the bridge 120, the pick-up head carriage 142, the base 140, or a combination thereof. A source substrate, chips coupled to the source substrate, a product substrate, or all three can be registered in their respective stage coordinates before chips are transferred from the source substrate to the product substrate. The information from the registration hardware 158 can be used to determine the source pitch for the plurality of chips 522 (illustrated in FIG. 5). Further, the information may be used to identify or confirm the plurality of chips 522 are the correct chips being transferred. The information from the registration hardware 128 can be used to determine the product pitch for the product bonding sites of the product substrate 548 (illustrated in FIG. 5). Further, the information may be used to identify or confirm the product substrate 548 is the correct substrate to which chips will be transferred.

Returning to FIG. 1, the apparatus 100 can be controlled by a controller 160 in communication with the bridge 120, any component coupled to the bridge 120, the base 140, any component coupled to the base 140, or a combination thereof. The controller 160 can operate on a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 100. In another implementation (not illustrated), the controller 160 can be at least part of a computer external to the apparatus 100, where such computer is bidirectionally coupled to the apparatus 100. The memory 162 can include a non-transitory computer readable medium that includes instructions to carry out the actions associated with the transfer operation. In another embodiment, the bridge 120, a component coupled to the bridge 120, the base 140, or a component coupled to the base 140 can include a local controller that provides some of the functionality that would otherwise be provided by the controller 160.

Figure 3:
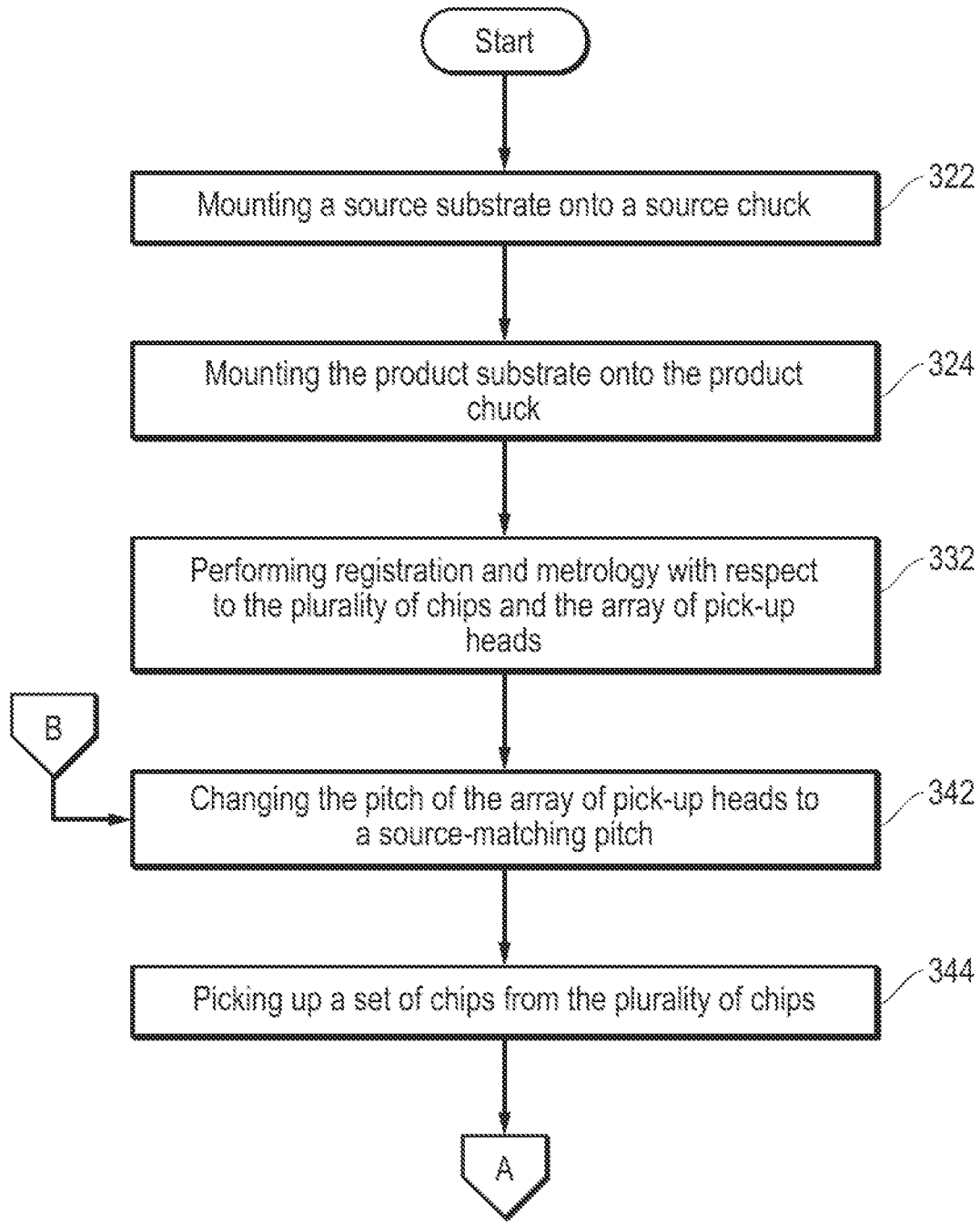
FIGS. 3 and 4 include a process flow diagram for a method of transferring and bonding chips to product bonding sites of a product substrate.
Figure 4:
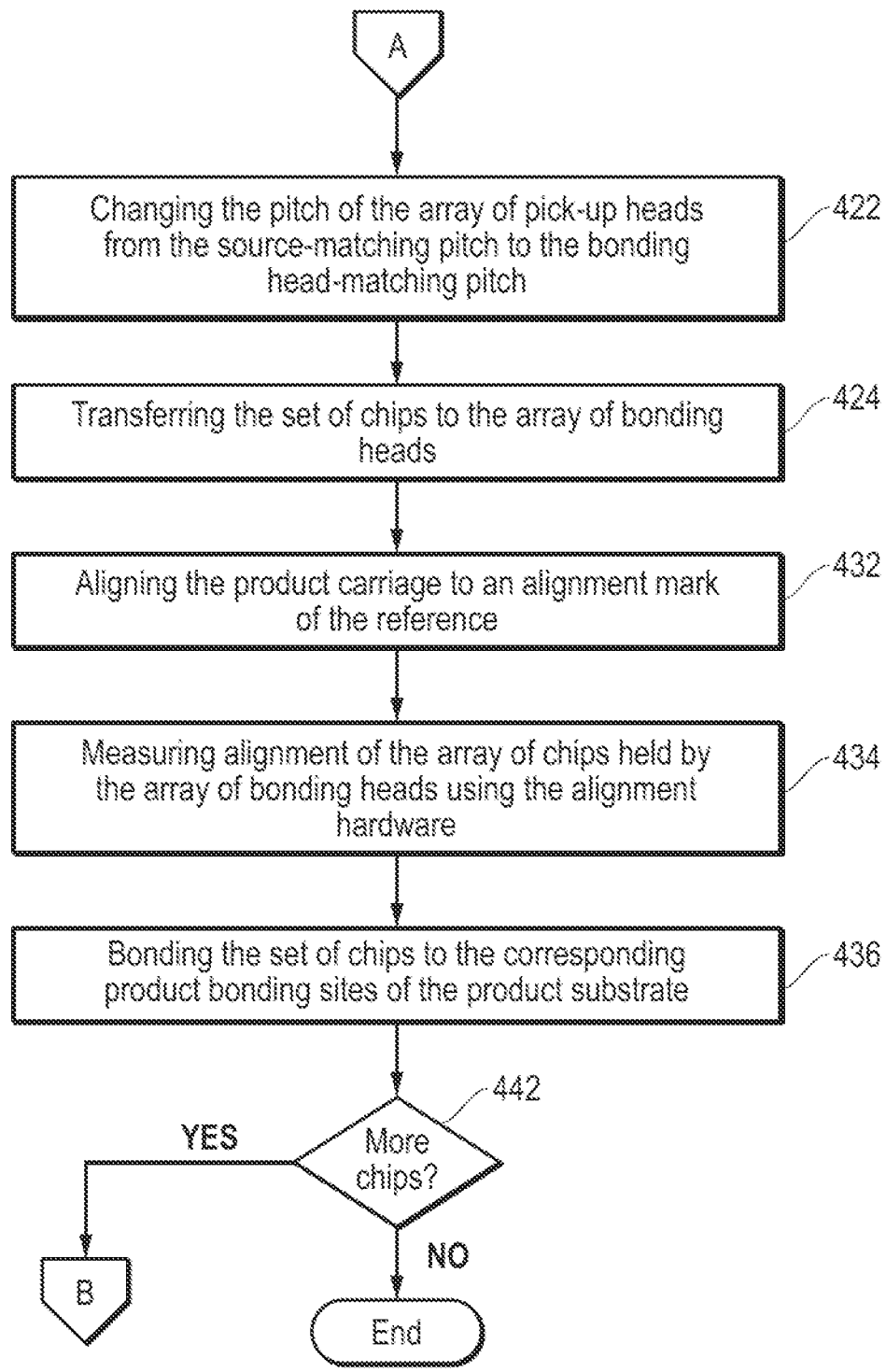

Attention is directed to methods of using the apparatus 100 when transferring a set of chips from a source substrate to product bonding sites on a product substrate. FIGS. 3 and 4 include a process flow diagram of a method that is described with respect to FIGS. 5 to 10. In FIGS. 5 to 10, the space between (1) the bridge 120 and components coupled to the bridge 120 and (2) the base 140 and components coupled to the base 140 is greatly exaggerated to allow reference numbers and corresponding lead lines to be easier to see. In practice, the bridge 120 and base 140 may be significantly closer to each other than as illustrated.

Before starting the method, the chips and product substrate can be prepared such that the chips, the product substrate, or both have activated surfaces to aid in bonding. After cleaning, a surface can be activated by exposing the surface to a plasma treatment and deionized water rinse to hydrate the surface. Where reasonably practical, contact with an activated surface should be avoided.

Figure 5:
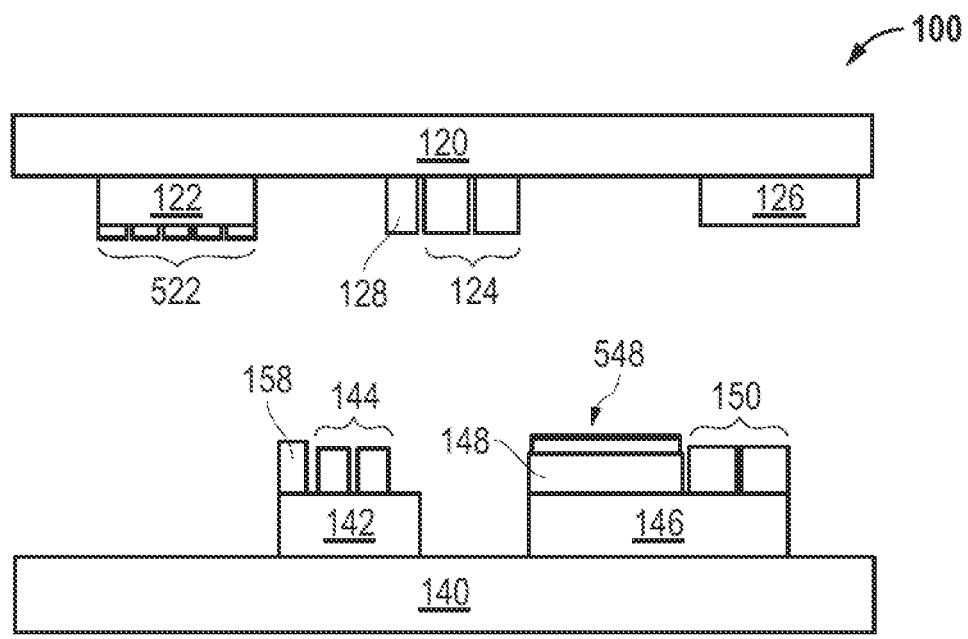
FIG. 5 includes an illustration of a cross-sectional view of the apparatus after loading a source substrate and a product substrate into the apparatus.

The method can include mounting a source substrate onto the source chuck at block 322 and mounting the product substrate onto the product chuck at block 324 in FIG. 3. As illustrated in FIG. 5, the pick-up head carriage 142 and the product head carriage 146 may be moved to allow easier access to the source chuck 122 and product chuck 148. The actions in blocks 322 and 324 can be performed in either order. For example, the plurality of chips 522 can be mounted before or after mounting the product substrate 548.

Referring to FIG. 5, the plurality of chips 522 can be attached to a source substrate (not separately illustrated) coupled to the source chuck 122 that is coupled to the bridge 120. The source substrate can hold the plurality of the chips 522, all or which or only a part of the plurality, are to be transferred to the product substrate. The source substrate can be an adhesive tape that may be in the form of a tape frame or tape reel, a container having a lattice that defines a matrix of regions that can hold the plurality of chips 522, or the like. The plurality of chips can have bonding surfaces that face the base 140 or a component coupled to the base 140.

A chip within the plurality of chips 522 can include a microprocessor, a microcontroller, a graphic processing unit, a digital signal processor, a memory chip (for example, a Level 2 or Level 3 cache, a flash memory, or the like), a power transistor chip, a power circuit chip, or the like. The chip has a device side, which has most or all of the electrical circuit elements of the chip, and a back side opposite the device side. In the embodiment as illustrated in FIG. 5, the back sides of the chips within the plurality of chips 522 are disposed between the source chuck 122 and the device sides of the chips. In another embodiment, the device side of the chips within the plurality of chips 522 are disposed between the source chuck 122 and the back sides of the chips. The sides of the chips facing the base 140 are activated for hybrid bonding to the product substrate 548.

The product substrate 548 can include any of the substrates described with respect to the source substrate and can also include a semiconductor wafer, a package substrate, a printed wiring board, a circuit board, an interposer, or the like. Microelectronic devices may be part of the product substrate 548, such as a semiconductor wafer. The package substrate, the printed wiring board, the circuit board, or the interposer may or may not have chips mounted thereto. Part or all of the side of the product substrate 548 can be activated for hybrid bonding.

Figure 6:
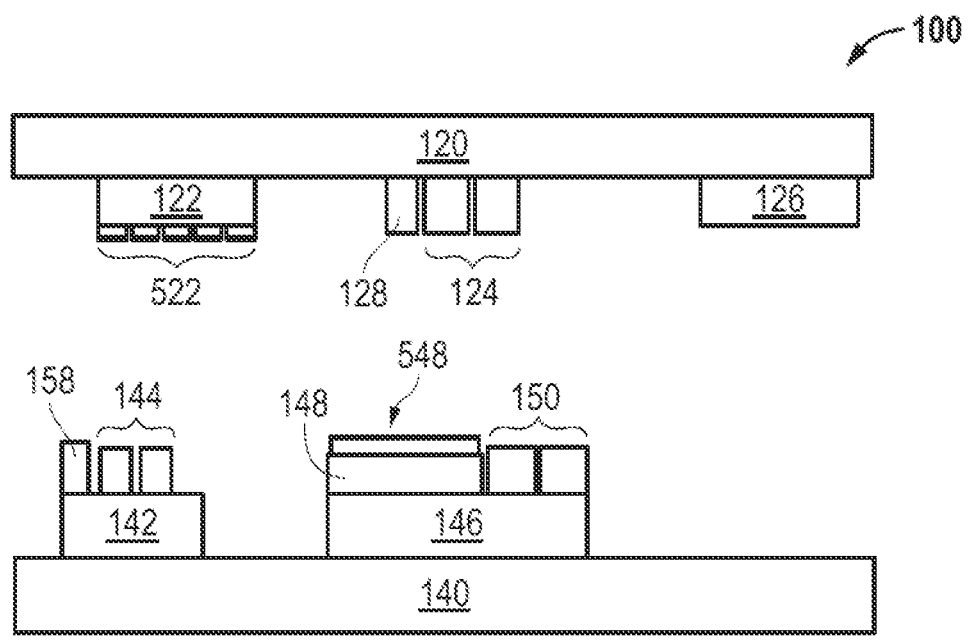
FIG. 6 includes an illustration of a cross-sectional view of the apparatus during a registration operation.

The method can include performing registration and metrology with respect to the plurality of chips and the array of pick-up heads at block 332 in FIG. 3. FIG. 6 includes a cross-sectional view of the apparatus 100 as the registration hardware 128 and 158 are collecting information. Registration hardware 128 and 158 can perform the functions as previously described. The information from the registration hardware 158 can be transmitted to the controller 160 or a local controller and used to determine the source pitch for the plurality of chips 522 coupled to the source chuck 122. The information from the registration hardware 128 can be transmitted to the controller 160 or a local controller and used to determine the product pitch for the product bonding sites of the product substrate 548 and locations of the product bonding sites. If needed or desired, the information may be used to identify or confirm the plurality of chips 522 and the product substrate 548 are the correct.

Figure 7:
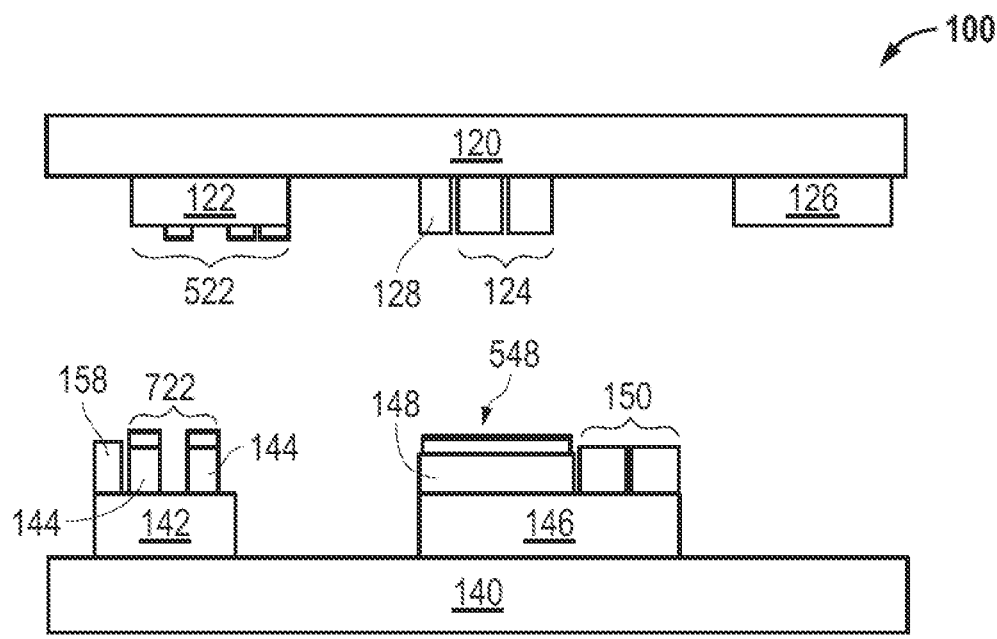
FIG. 7 includes an illustration of a cross-sectional view of the apparatus after an array of pick-up heads picked up a set of chips from a source substrate.

The method can further include changing the pitch of the array of pick-up heads to a source-matching pitch at block 342 in FIG. 3. In FIG. 7, the array of pick-up heads 144 are adjusted to have the source-matching pitch. The source-matching pitch can be the same or within an allowable tolerance of the source pitch.

The method can include picking up a set of chips from the plurality of chips at block 344 in FIG. 3. Chip chucks of the array of pick-up heads 144 can be extended in the Z-direction and pick up a set of chips 722 as illustrated in FIG. 7. Any of the previously described pick-up heads may be used. The chips that are picked up may be chips that are closest to each other, or one or more other chips may be between the picked-up chips, such as illustrated in FIG. 7. Chips not picked up remain coupled to the source chuck 122 as illustrated in FIG. 7.

In an embodiment, the array of pick-up heads 144 do not contact the activated surfaces of the chips being transferred. The chip chucks for the array of pick-up heads 144 can have a design that allows chips to be picked up along side surfaces of the chips, where the side surfaces are between the device and back sides of the chips. Referring to FIG. 2, the chip chuck 2444 with its projections 2448 can allow chips to be picked up by the sides, so that an activated surface of the chip does not contact the pick-up surface 2446.

If the chip is too thin to be held by its sides, a backing plate can be coupled to the chip. For example, a chip may have a thickness less than 50 microns. A thickness of the backing plate or a combined thickness of the backing plate and chip is sufficient to allow the pick-up head to pick up the backing plate or a combination of the backing plate and chip without having an activated surface of the chip contacting the pick-up surface of the pick-up head. The backing plate can have a thickness in a range from 100 microns to 500 microns.

The backing plate can be coupled to the chip using an adhesive compound. The backing plate may be removed at a later time or remain coupled to the chip in the finished electrical device. After the chip is bonded to the product substrate 548, the backing plate may be removed. In an embodiment, the adhesive compound may be deactivated by exposure to actinic radiation. The actinic radiation may be in a range from 100 nm to 1000 nm. In such an embodiment, at least 70% of the actinic radiation to be transmitted through the backing plate. In another embodiment, a solvent can be used to remove the adhesive compound from between the chip and the backing plate.

In another implementation, a chip may not have an activated surface but has a relatively fragile component along a surface that will contact the product substrate 148 and should not contact the pick-up surface of the chip chuck of a pick-up head within the array of pick-up heads 144. A pick-up head as described with respect to the chip having the activated surface can be used for the chip with a fragile component along the surface facing the pick-up surface of the pick-up head.

Figure 8:
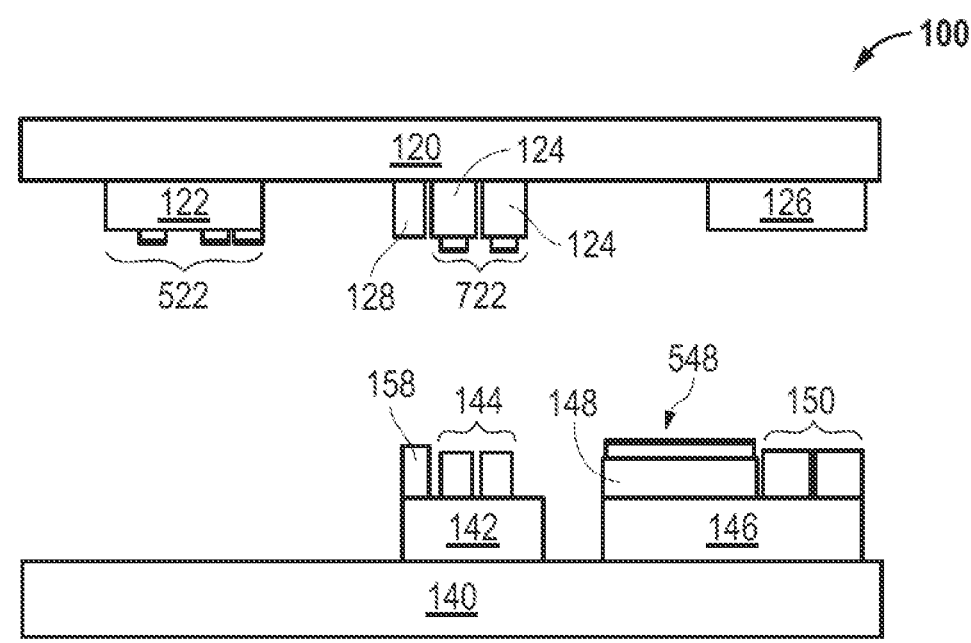
FIG. 8 includes an illustration of a cross-sectional view of the apparatus after transferring the set of chips from the array of pick-up heads to the array of bonding heads.

The method can further include changing the pitch of the array of pick-up heads from the source-matching pitch to the bonding head-matching pitch at block 422 in FIG. 4. Referring to FIGS. 7 and 8, the pitch for the array of pick-up heads 144 is changed from the source-matching pitch to the bonding head-matching pitch. The set of chips 722 are coupled to the array of pick-up heads 144 when the pitch for the array of pick-up heads 144 is changed. The bonding head-matching pitch for the array of pick-up heads 144 can be the same or within an allowable tolerance of the bonding head pitch for the array of bonding heads 124.

The method can include transferring the set of chips to the array of bonding heads at block 424 in FIG. 4. Referring to FIGS. 7 and 8, the pick-up head carriage 142 and product carriage 146 are moved to the right. The pick-up head carriage 142 is moved so that the array of bonding heads 124 is over the array of pick-up heads 144. If needed or desired, the registration hardware 128, 158, or both can be used to confirm the array of pick-up heads 144 are properly positioned with respect to the array of bonding heads 124. The chip chucks for pick-up heads within the array of pick-up heads 144 can be extended toward the bonding heads within the array of bonding heads 124, the chip chucks for the bonding heads within the array of bonding heads 124 can be extended toward the pick-up heads within the array of pick-up heads 144, or both. FIG. 8 includes the set of chips 722 after the set of chips 722 is transferred from the array of pick-up heads 144 to the array of bonding heads 124.

The method can further include aligning the product carriage to an alignment mark of the reference at block 432 in FIG. 4. The action in block 432 may be performed when performing the action in block 422 or block 424 or performing the actions in blocks 422 and 424. Alternatively, the action in block 432 can be performed at a time different from performing actions 422 and 424.

Referring to FIG. 8, the alignment hardware 150 coupled to the product carriage 146 is used to align the product carriage 146 to one or more alignment marks of the reference 126. The alignment of components within the apparatus 100 may drift due to a temperature change, vibration, or another cause. The alignment can be performed more than once per transfer operation and may be performed on average about one time per transfer cycle.

Figure 9:
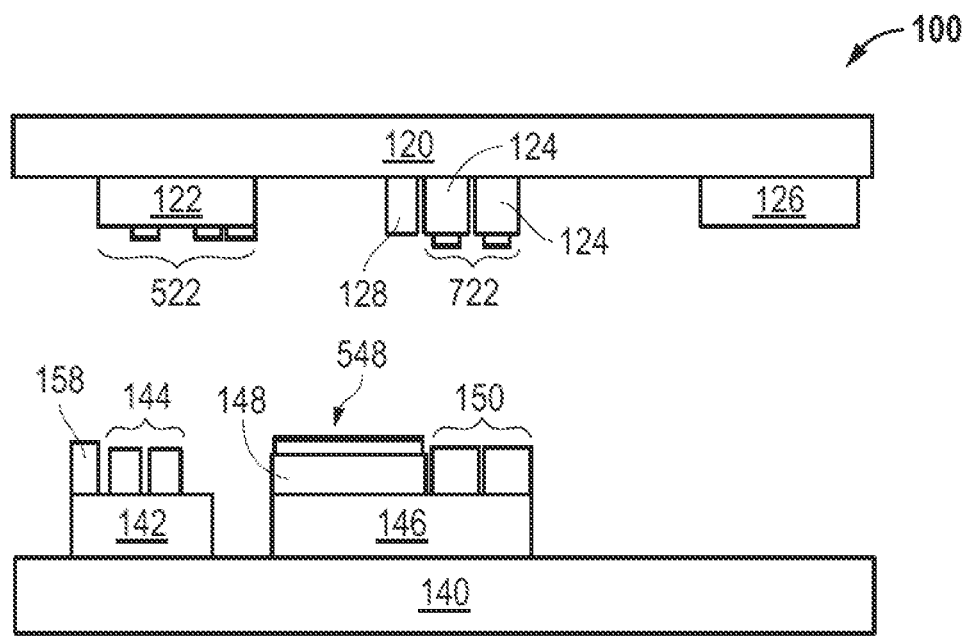
FIG. 9 includes an illustration of a cross-sectional view of the apparatus during an alignment measurement operation.

The method can include measuring alignment of the array of chips held by the array of bonding heads using the alignment hardware at block 434 in FIG. 4. Referring to FIG. 9, after the set of chips 722 are transferred to the array of bonding heads 124, the pick-up head carriage 142 and the product carriage 146 are moved to the right. While the alignment hardware 150 is under the set of chips 722, one or more alignment measurements can be taken. As previously described, the chip chucks for the bonding heads within the array of bonding heads 124 can allow for limited motion. The chip chucks can be moved to reduce the amount of misalignment. The amount of misalignment will be no greater than an allowable tolerance. If the misalignment is within tolerance, the method can continue. If the misalignment is outside tolerance, a signal can be transmitted to the controller 160 or local controller with such information. The method can be suspended until human or other intervention occurs. The continued description of the method is based on the misalignment being within tolerance or human or other intervention was successful.

Figure 10:
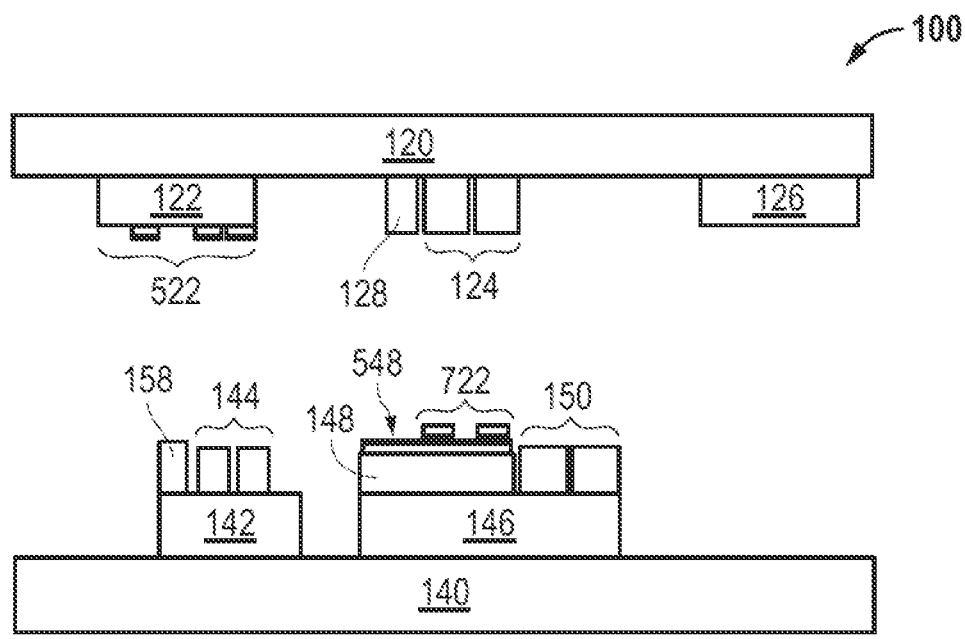
FIG. 10 includes an illustration of a cross-sectional view of the apparatus bonding the set of chips to product bonding sites of the product substrate.

The method can further include bonding the set of chips to the corresponding product bonding sites of the product substrate at block 436 in FIG. 4. The chip chucks for the array of bonding heads 124 can be extended toward the product substrate 548, the product chuck 148 can be extended toward the array of bonding heads 124, or both. Pressure is exerted to bond the set of chips 722 to corresponding product bonding sites of the product substrate 548. In an embodiment, the bonds can be oxide-to-oxide bonds. The pressure during bonding can be in a range 0.5 N/cm$^2$ to 20 N/cm$^2$. The bonding can be performed at room temperature (for example, at a temperature in a range from 20° C. to 25° C.) or higher. Bonding is performed at a temperature less than a subsequent anneal to expand conductive metal within the chips and at the product bonding sites. The temperature and pressure may be limited depending on films present during bonding or components within the apparatus 100. For example, the temperature may be no higher than approximately 200° C. After reading this specification, skilled artisans will be able to determine the pressure and temperature used for bonding. FIG. 10 includes a cross-sectional view apparatus 100 after the set of chips 722 are bonded to corresponding product bonding sites of the product chuck 148. At this point in the method, one transfer cycle has been completed.

A determination is made whether more chips are to be transferred from the source substrate to the product substrate at decision diamond 442 in FIG. 4. If more chips are to be transferred ("YES" branch), the method continues starting at block 342 in FIG. 3 with a next set of chips transferred during another transfer cycle. The method can be iterated as many times as needed for the product substrate 548 to have a desired number of chips. If no more chips are to be transferred ("NO" branch from decision diamond 442 in FIG. 4), the transfer operation is completed, and the method of transferring chips ends.

A hybrid bonding process can include three steps that include a bonding operation, a first anneal to cause the metal within the chips and at the product bonding sites to expand and contact each other, and a second anneal to cause metal atoms to cross the metal-metal interface and reduce contact resistance. The method previously described with respect to the flow chart in FIGS. 3 and 4 and as described and illustrated in FIGS. 5 to 10 can correspond to the bonding operation of a hybrid bonding process. The product substrate 548 can be removed from the apparatus 100 or moved to a different portion of the apparatus 100 or a different tool to perform the anneal operations.

Embodiments described herein provide benefits, particularly for a hybrid bonding process. The apparatus and methods allow for the transfer of chips from a source substrate to a product substrate at a high throughput rate while still achieving the challenging alignment specifications for hybrid bonding. The arrays of pick-up heads and bonding heads can allow a set of chips to be transferred and bonded to product bonding sites on a product substrate during a single transfer cycle.

The pitch for the array of pick-up heads can be reversibly changed during a transfer cycle from a pitch that is the same or close to a source pitch to another pitch that is the same or closer to the bonding head pitch. The relatively wider allowable tolerances for the pitch of pick-up heads within the array of pick-up heads allows the pitch of the pick-up heads to be switched more quickly between the source-matching pitch and the bonding head-matching pitch. A relatively narrower tolerance for the pitch of the bonding heads is not a significant problem because the arrangement of the array of bonding heads is not changed during a transfer operation that may last for a plurality of transfer cycles.

The orientation of the chips remains the same. During the entire transfer cycle, the device sides of the chips can face the same direction, and the back sides of the chips can face the opposite direction. The need for flipping chips is obviated.

Alignment of alignment hardware to a reference can be performed every transfer cycle. Thus, significant alignment drift during the entirety of a transfer operation is substantially reduced.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. An apparatus, comprising:
   a source chuck with a source holding surface facing a first direction;
   an array of pick-up heads having pick-up surfaces facing a second direction opposite the first direction and configured to have an adjustable pitch that can be reversibly changed between a source-matching pitch and a bonding head-matching pitch;
   an array of bonding heads having holding surfaces facing the first direction and configured to be at a bonding head pitch; and
   a product chuck having a product holding surface facing the second direction.

2. The apparatus of claim 1, wherein the apparatus is configured such that:
   the bonding head pitch is within a first tolerance of a product pitch during a bonding head-to-product substrate transfer state,
   the bonding head-matching pitch for the array of pick-up heads is within a second tolerance of the bonding head pitch during a pick-up head-to-bonding head transfer state, and
   the second tolerance is different from the first tolerance.

3. The apparatus of claim 1, further comprising a pick-up head carriage coupled to the array of pick-up heads.

4. The apparatus of claim 3, further comprising a product carriage coupled to the product chuck.

5. The apparatus of claim 4, wherein the pick-up head carriage and the product carriage are configured to move during a transfer cycle.

6. The apparatus of claim 5, further comprising a base coupled to the pick-up head carriage and the product carriage.

7. The apparatus of claim 1, further comprising a bridge coupled to the source chuck and the array of bonding heads.

8. The apparatus of claim 7, further comprising a reference coupled to the bridge, wherein the reference includes an alignment mark.

9. The apparatus of claim 8, further comprising an alignment hardware coupled to a product carriage and configured to align to the alignment mark of the reference.

10. The apparatus of claim 1, wherein a particular pick-up head within the array of pick-up heads is configured to pick up a chip from the source chuck without contacting a surface along a major side of the chip, wherein the surface of the chip faces the pick-up surface of the particular pick-up head.

11. The apparatus of claim 1, wherein a pick-up head within the array of pick-up heads has a projection that is configured to contact a side of a chip or a side of a backing plate coupled to the chip.

12. An apparatus, comprising:
a source chuck with a source holding surface facing a first direction;
an array of pick-up heads having pick-up surfaces facing a second direction opposite the first direction;
an array of bonding heads having holding surfaces facing the first direction;
a product chuck having a product holding surface facing the second direction;
a pick-up head carriage coupled to the array of pick-up heads;
a product carriage coupled to the product chuck;
a bridge coupled to the source chuck and the array of bonding heads; and
a base spaced apart from the bridge and coupled to the pick-up head carriage and the product carriage.

13. A method, comprising:
mounting a source substrate onto a source chuck, wherein:
the source substrate includes a plurality of chips,
bonding surfaces of the plurality of chips face a first direction, and
a first set of chips within the plurality of chips is at a source pitch;
picking up the first set of chips with an array of pick-up heads, wherein the array of pick-up heads has pick-up surfaces that face a second direction opposite the first direction, and the array of pick-up heads is at a source-matching pitch;
changing the array of pick-up heads from the source-matching pitch to a bonding head-matching pitch;
transferring the first set of chips to an array of bonding heads having holding surfaces that face the first direction, wherein the array of bonding heads is at a bonding head pitch, and the array of pick-up heads is at the bonding head-matching pitch; and
bonding the first set of chips to a first set of product bonding sites of a product substrate, wherein the product substrate is coupled to a product chuck, and the first set of product bonding sites faces the second direction and is at a product bonding pitch.

14. The method of claim 13, wherein changing the array of pick-up heads from the source-matching pitch to the bonding head-matching pitch is performed while the first set of chips is coupled to the array of pick-up heads.

15. The method of claim 13, further comprising changing the array of pick-up heads from the bonding head-matching pitch to the source-matching pitch after transferring the first set of chips to the array of bonding heads.

16. The method of claim 15, wherein:
mounting the source substrate onto the source chuck comprises mounting the source substrate, wherein the plurality of chips includes a second set of chips, and
the method further comprises:
picking up the second set of chips with the array of pick-up heads, wherein the array of pick-up heads is at the source-matching pitch;
changing the array of pick-up heads from the source-matching pitch to the bonding head-matching pitch;
transferring the second set of chips to the array of bonding heads; and
bonding the second set of chips to a second set of product bonding sites of the product substrate, wherein the second set of product bonding sites faces the second direction.

17. The method of claim 16, wherein from a first time when the first set of chips is transferred from the array of pick-up heads to the array of bonding heads to a second time when the second set of chips is bonded to the product bonding sites, bodies of the array of the bonding heads remain at the bonding head pitch.

18. The method of claim 16, further comprising aligning a product carriage to an alignment mark of a reference after bonding the first set of chips to the product substrate and before bonding the second set of chips to the product substrate, wherein no chips from the source substrate are bonded to the product substrate between bonding the first set of chips to the product substrate and bonding the second set of chips to the product substrate.

19. The method of claim 13, further comprising moving a pick-up head carriage from a source location to a bonding head location, wherein:
the array of pick-up heads is coupled to the pick-up head carriage,
when the pick-up head carriage is at the source location, the array of pick-up heads faces the source substrate, and
when the pick-up head carriage is at the bonding head location, the array of pick-up heads faces the holding surfaces of the array of bonding heads.

20. The method of claim 13, wherein picking up the first set of chips is performed without contacting surfaces along major surfaces of the first set of chips while the surfaces face the array of pick-up heads.

21. The method of claim 13, wherein the array of pick-up heads faces the source substrate when the array of bonding heads faces the product substrate.

* * * * *